United States Patent [19]

Lur et al.

[11] Patent Number: 5,529,948
[45] Date of Patent: Jun. 25, 1996

[54] LOCOS TECHNOLOGY WITH REDUCED JUNCTION LEAKAGE

[75] Inventors: Water Lur, Taipei; Dey Y. Wu, Hsin-Chu; Jiunn Y. Wu, Dou-Lio, all of Taiwan

[73] Assignee: United Microelectronics Corporation, Hsinchu, Taiwan

[21] Appl. No.: 276,612

[22] Filed: Jul. 18, 1994

[51] Int. Cl.$^6$ ........................................ H01L 21/76
[52] U.S. Cl. ................... 437/70; 437/69; 437/28
[58] Field of Search ................... 437/69, 70, 72, 437/73, 28

[56] References Cited

U.S. PATENT DOCUMENTS

| | | | |
|---|---|---|---|
| 4,981,813 | 1/1991 | Bryant et al. | 437/73 |
| 4,986,879 | 1/1991 | Lee | 437/72 |
| 5,139,964 | 8/1992 | Onishi et al. | 437/70 |
| 5,220,192 | 6/1993 | Owens et al. | 437/70 |
| 5,240,874 | 8/1993 | Roberts | 437/69 |
| 5,242,849 | 9/1993 | Sato | 437/70 |
| 5,256,895 | 10/1993 | Bryant et al. | 437/69 |
| 5,344,787 | 9/1994 | Nagalingam et al. | 437/70 |

FOREIGN PATENT DOCUMENTS

| | | | |
|---|---|---|---|
| 0133929 | 5/1990 | Japan | 437/70 |

OTHER PUBLICATIONS

VLSI Technology, by S. M. Sze, International Edition, McGraw–Hill Book Co., N.Y. N.Y.C. 1988, pp. 473–474.

*Primary Examiner*—Trung Dang

*Attorney, Agent, or Firm*—George O. Saile; Rosemary L. S. Pike

[57] ABSTRACT

A new method of local oxidation using an additional source/drain implantation to protect the area from crystalline defects and thereby reduce junction leakage is achieved. A pad silicon oxide layer is provided over the surface of a silicon substrate. A silicon nitride layer followed by a silicon dioxide layer is deposited overlying the pad silicon oxide layer. Portions of the silicon dioxide, silicon nitride, and pad silicon oxide layers not covered by a mask are etched away to provide an opening to the silicon substrate where the field oxidation region is to be formed. Silicon nitride spacers are formed on the sidewalls of the opening. Channel-stop ions are selectively implanted through the opening into the substrate underneath the opening. The silicon substrate is oxidized within the opening to form the field oxidation region. Stress-generated crystalline defects are formed underlying the field oxidation region at the edges of the opening. The silicon nitride spacers are removed. An additional source/drain ion implantation is performed by implanting ions with energy high enough so that the ions form implanted regions deep enough into the silicon substrate so that the crystalline defects are enclosed within the implanted regions and wherein the enclosure of the crystalline defects within the implanted regions reduces junction leakage. The silicon dioxide, silicon nitride, and pad silicon oxide layers are removed completing the field oxidation of the integrated circuit.

22 Claims, 8 Drawing Sheets

LOCOS TECHNOLOGY WITH REDUCED JUNCTION LEAKAGE

BACKGROUND OF THE INVENTION

1. Field of the Invention

This invention relates to the fabrication of integrated circuit devices and more particularly to a method of local oxidation using modified junction depth around the bird's beak to reduce junction leakage in the fabrication of integrated circuits.

2. Description of the Prior Art

Local oxidation of silicon is the conventional lateral isolation scheme. The conventional local oxidation process (LOCOS) is described in *VLSI Technology*, International Edition, by S. M. Sze, McGraw-Hill Book Company, N.Y., N.Y., c. 1988 by McGraw-Hill Book Co., pp. 473–474. Referring to FIG. 1, a layer of silicon nitride 3 is deposited over a pad oxide 2 overlying a silicon substrate 1. The pad oxide is a thin thermal oxide which allows better adhesion between the nitride and silicon and acts as a stress relaxation layer during field oxide formation. The nitride and oxide layers are etched to leave openings 4 exposing portions of the silicon substrate where the local oxidation will take place. A boron channel-stop layer 5 is ion implanted into the isolation regions. Referring now to FIG. 2, the field oxide 6 is grown within the openings.

There are many disadvantages to the conventional LOCOS method. Bird's beak encroachment 7 is caused by the lateral oxidation of silicon along the pad oxide under the nitride layer. Other disadvantages include the white ribbon effect caused by the diffusion of nitrogen-like material from the compressive-stressed nitride layer edge into the neighboring underlying tensile-stressed pad oxide layer, width narrowing, non-recessed surface, and tremendous stress generated during high-temperature oxidation of silicon. Many crystalline defects 8 including dislocations and stacking faults are generated by the relaxation of these tremendous stresses around the bird's beak. Because p+/n or n+/p junctions, shown as 9 in FIG. 3, occur in the area of the bird's beak 7, these crystalline defects 8 intersect the junctions resulting in leakage paths. Low power devices, for example, 1M static random access memory (SRAM), 4M SRAM, etc., require a very tiny leakage current of about 0° 5 pA, within the standby current specification of about 0.5 µA, to prevent data loss. Using conventional LOCOS processes, the junction leakage through stress-induced defects is too large, about 1 pA per cell, to be acceptable during device operation.

FIG. 4 illustrates the misalignment of a contact. Gate electrode 61 is covered by insulating layer 62. A contact opening has been made through the insulating layer 62 to contact the source/drain region 9. However, the contact opening is misaligned. The misalignment of the contact pattern exposes some of the FOX 6 region. This region 6 is etched away to expose the underlying substrate during the contact etching process. When the contact is filled with metal 64, the inevitable short from metal to substrate will cause the function to fail.

To avoid the shorting problem due to misalignment, a plug or contact implant is made, as illustrated in FIG. 5. The plug or contact implant 63 is performed after the contact etching to ensure that the metal will contact to a heavily doped source/drain area even if there is a misalignment during contact pattern definition. Typically the dosage of the plug or contact implantation is similar to the previous source/drain implantation and a post thermal treatment, such as higher than 800° C. for about 30 minutes, is needed for dopant activation. The plug or contact implantation has been a popular process in the fabrication of submicron Very Large Scale Integrated (VLSI) circuits. However, even with the presence of the plug or contact implantation, LOCOS induced defects cause unacceptable junction leakage.

U.S. Pat. No. 4,986,879 to Lee teaches a method of local oxidation using a thick pad oxide layer and a thin silicon nitride sidewall to release stress. U.S. Pat. No. 4,981,813 to Bryant et al teaches a method using silicon nitride sidewalls and recessed silicon to fabricate a narrower width field oxide region with a reduced bird's beak. U.S. Pat. No. 5,139,964 to Onishi et al uses a silicon nitride sidewall and a substrate recessed under the sidewall to achieve local oxidation with reduced stress and a higher breakdown voltage. However, more or less LOCOS induced stress is still there to generate crystalline defects resulting in unacceptable junction leakage.

SUMMARY OF THE INVENTION

A principal object of the invention is to provide an effective and very manufacturable method to locally oxidize the silicon in an integrated circuit.

Another object of the invention is to provide a method of locally oxidizing the silicon in an integrated circuit whereby the source/drain junction is protected from crystalline defects.

Yet another object of the present invention is to provide a method of local oxidation of silicon that will protect the source/drain junction from crystalline defects with minimal active area width narrowing.

A further object is to provide a method of local oxidation of silicon that would not require a plug or contact implant to prevent shorting due to contact misalignment.

In accordance with the objects of this invention, a new method of local oxidation using an additional source/drain implantation to protect the area from crystalline defects and thereby reduce junction leakage is achieved. A pad silicon oxide layer is provided over the surface of a silicon substrate. A silicon nitride layer is deposited overlying the pad silicon oxide layer. A silicon dioxide layer is deposited overlying the silicon nitride layer. Portions of the silicon dioxide, silicon nitride, and pad silicon oxide layers not covered by a mask are etched away to provide an opening to the silicon substrate where the field oxidation region is to be formed. Silicon nitride spacers are formed on the sidewalls of the opening. Channel-stop ions are selectively implanted through the opening into the substrate underneath the opening.

The silicon substrate is oxidized within the opening to form the field oxidation region. Stress-generated crystalline defects are formed underlying the field oxidation region at the edges of the opening. The silicon nitride spacers are removed. An additional source/drain ion implantation is performed by implanting ions with energy high enough so that the ions form implanted regions deep enough into the silicon substrate so that the crystalline defects are enclosed within the implanted regions and wherein the enclosure of the crystalline defects within the implanted regions reduces junction leakage. The silicon dioxide, silicon nitride, and pad silicon oxide layers are removed completing the field oxidation of the integrated circuit.

In a second embodiment of the invention, a pad silicon oxide layer is provided over the surface of a silicon substrate. A silicon nitride layer is deposited overlying the pad silicon oxide layer. Portions of the silicon nitride and pad silicon oxide layers not covered by a mask are etched away to provide an opening to the silicon substrate where the field oxidation region is to be formed. Channel-stops are selectively ion implanted through the opening into the substrate underneath the opening.

The silicon substrate within the opening is oxidized to form the field oxidation region. Stress-generated crystalline defects are formed underlying the field oxidation region at the edges of the opening. The surface of the substrate is coated with a planarizing layer. Portions of the planarizing layer above the top surface of the field oxidation region are removed. The silicon nitride layer not covered by the remaining planarizing layer is removed also. An additional source/drain ion implantation is performed by implanting ions with energy high enough so that the ions form implanted regions deep enough into the silicon substrate so that the crystalline defects are enclosed within the implanted regions and wherein the enclosure of the crystalline defects within the implanted regions reduces junction leakage. The silicon nitride and pad silicon oxide layers are removed completing the field oxidation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 6:
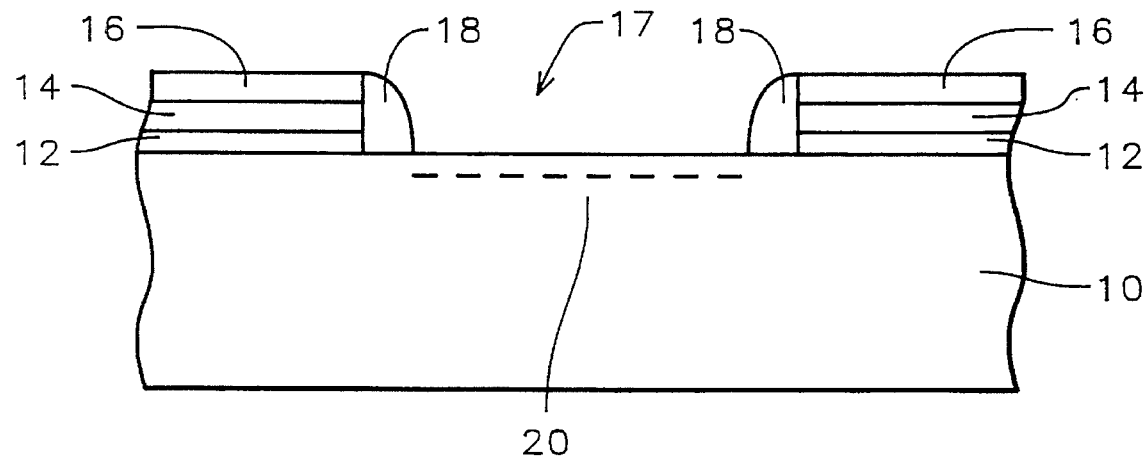
FIGS. 6 through 9 schematically illustrate in cross-sectional representation one preferred embodiment of the present invention.

Referring now to FIGS. 6 through 9, a first preferred embodiment of the invention will be described. Referring now more particularly to FIG. 6, there is shown a monocrystalline silicon substrate 10. A pad oxide layer 12 of silicon dioxide is chemically vapor deposited (CVD) or thermally grown on the surface of the substrate to a preferred thickness of between about 100 to 500 Angstroms. A silicon nitride layer 14 is deposited by CVD to a thickness of between about 500 to 2500 Angstroms. A second layer of silicon dioxide 16 is CVD deposited overlying the silicon nitride layer 14 to a thickness of between about 500 to 2000 Angstroms. The pad oxide, silicon nitride, and silicon dioxide layers are patterned to leave openings 17 exposing portions of the silicon substrate where the local oxidation will take place.

A layer of silicon nitride is deposited by CVD over the surface of the substrate and within the openings 17. The layer is etched anisotropically to form spacers 18 with a width of between about 1000 to 2000 Angstroms on the sidewalls of the opening 17.

Channel-stops 20 are selectively ion implanted into the substrate through the opening 17. For example, boron ions are implanted with a dosage of between about 1 E 13 to 1 E 14 atoms/cm$^2$ and at an energy of between about 10 to 50 KeV. The channel-stop implants serve to prevent inversion of p-type silicon under the field oxide.

Figure 7:
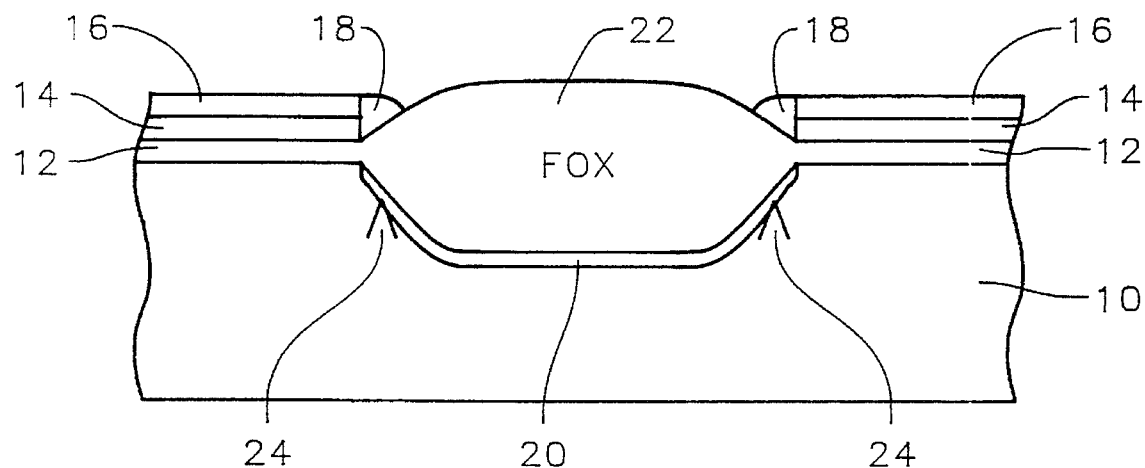

Referring now to FIG. 7, field oxidation is performed within the openings 17 at a temperature of between about 850° to 1050° C. for between about 10 to 720 minutes. Field oxide region 22 is formed. Crystalline defects 24, generated by stress, form in the silicon substrate under the bird's beak area of the field oxide region.

Figure 8:
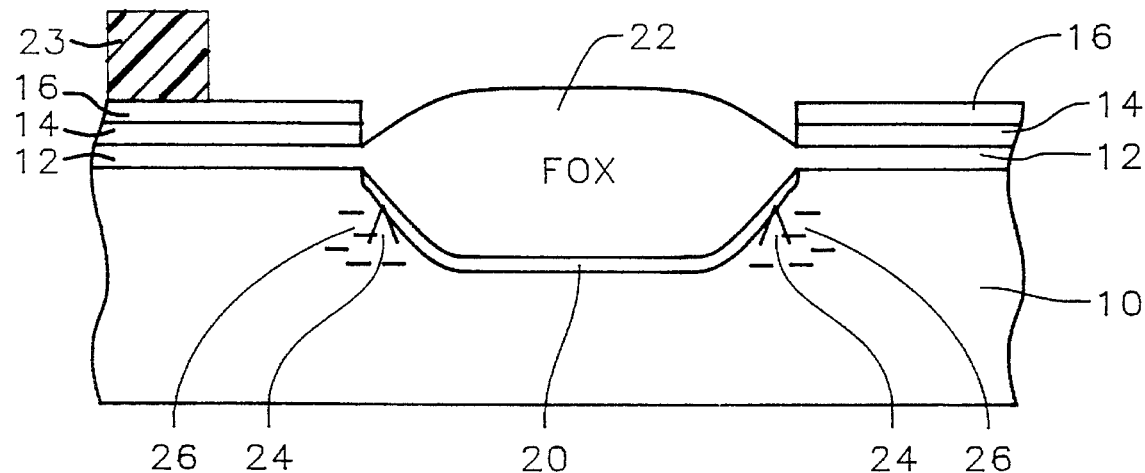

Referring now to FIG. 8, the silicon nitride spacers 18 are etched away by reactive ion etching using $SF_6$, He, or the like. The key additional source/drain implant of the present invention will now be described.

The mask for this high-energy implantation will be the silicon nitride layer 14, silicon dioxide 16, field oxide region 22, and an additional photoresist with polysilicon pattern 23 to provide the implanted regions around the field oxide and under the bird's beak to envelope the stress-induced crystalline defects. In addition, these high-energy implanted species should not be present under the polysilicon gate lines to avoid the short between the source and drain regions.

The ions and dosage used are the same as or similar to that which will be used in the normal source/drain implantation to be performed later. The energy used is higher than the normal source/drain implant. This high-energy implantation will drive the ions 26 deep into the substrate into the location of the crystalline defects 24. The energy must be large enough to form a deep enough junction to envelope all the stress-induced crystalline defects around the field oxide. On the other hand, the energy should not be large enough to penetrate the field oxide as well as the stacked layers of pad oxide 12, silicon nitride 14, and silicon dioxide 16. Energies for this implantation can be roughly estimated to be between about 25 to 70 KeV for B+, 110 to 300 for $BF_2$+, 60 to 200 KeV for P+, and 150 to 450 for As+ ions. Among these ions, B+ and $BF_2$+ are used for PMOS and P+ and As+ are used for NMOS.

Figure 9:
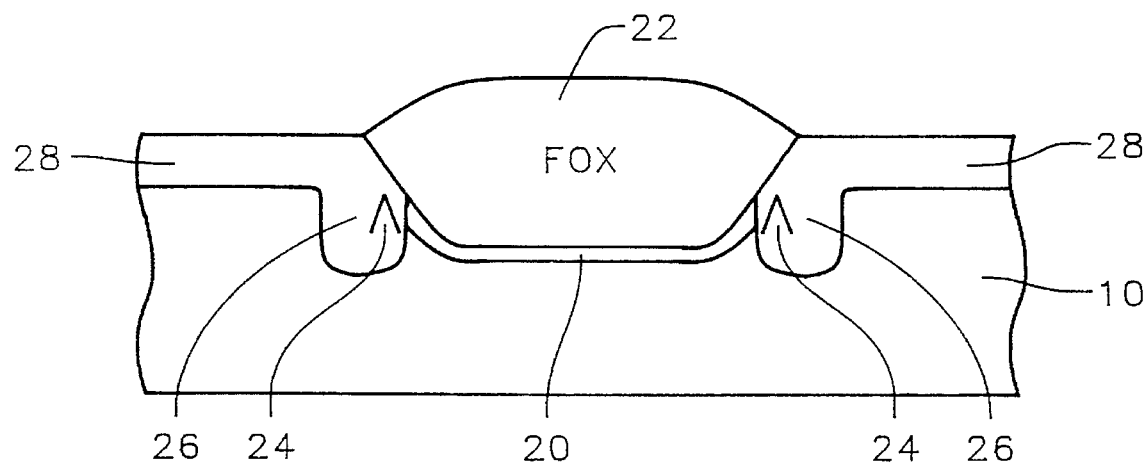

Referring now to FIG. 9, the silicon nitride layer 14 is stripped by hot $H_3PO_4$. The top silicon dioxide layer 16 is removed by lift-off. Alternatively, the top silicon dioxide layer 16 could be removed before the stripping of the silicon nitride layer 14 by dipping in a hydrofluoric acid solution. This would also remove some of the top layer of the field oxide 22 resulting in a more planarized surface. The pad oxide layer 12 is removed by dipping in a hydrofluoric acid solution. A gate silicon oxide layer is now formed as is conventional in the art followed by polysilicon gate electrode fabrication, not shown. Source/drain regions 28 are now formed using a normal source/drain implantation with normal energy of between about 15 to 100 KeV. N+ regions are formed by implanting P+ or As+ ions with a dosage of between about 2 E 15 to 5 E 15 atoms/cm$^2$. P+ regions are formed by implanting B+ or $BF_2$+ ions with a similar dosage.

Figure 10:
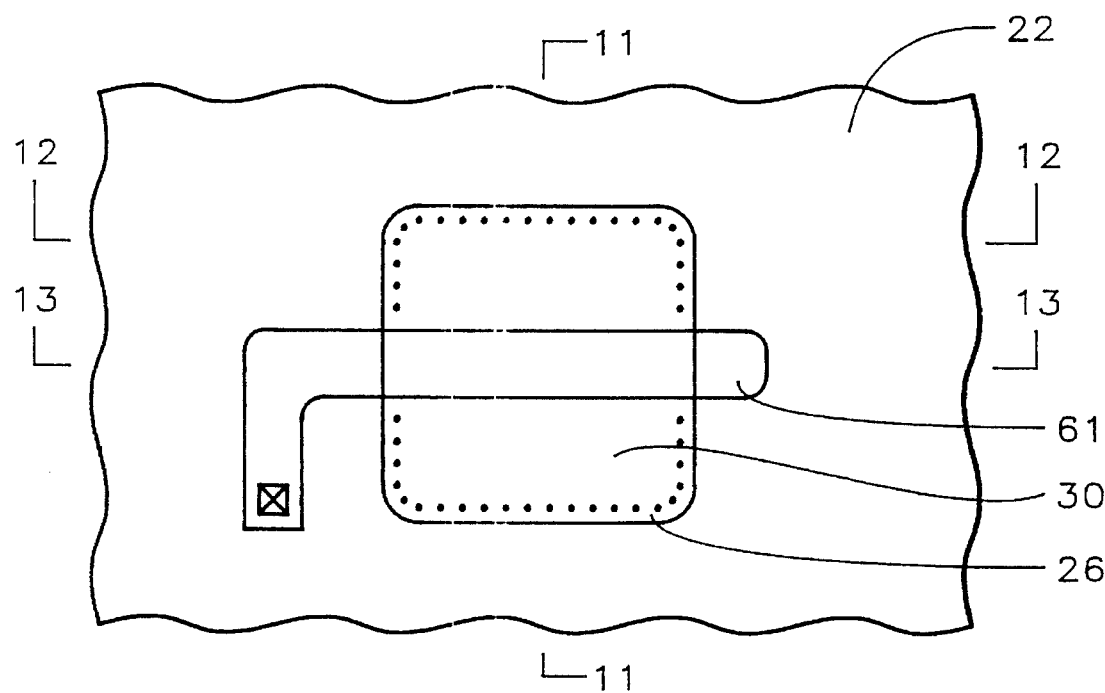
FIG. 10 schematically illustrates in cross-sectional representation a contact misalignment in the present invention.
Figure 11:
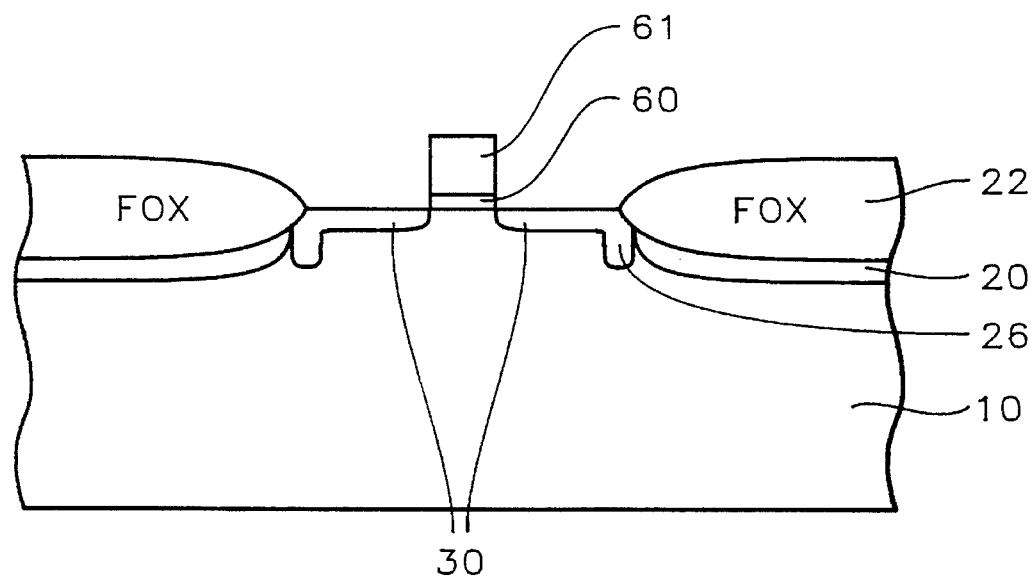
FIGS. 11 through 14 schematically illustrate in cross-sectional representation a second preferred embodiment of the present invention.
Figure 12:
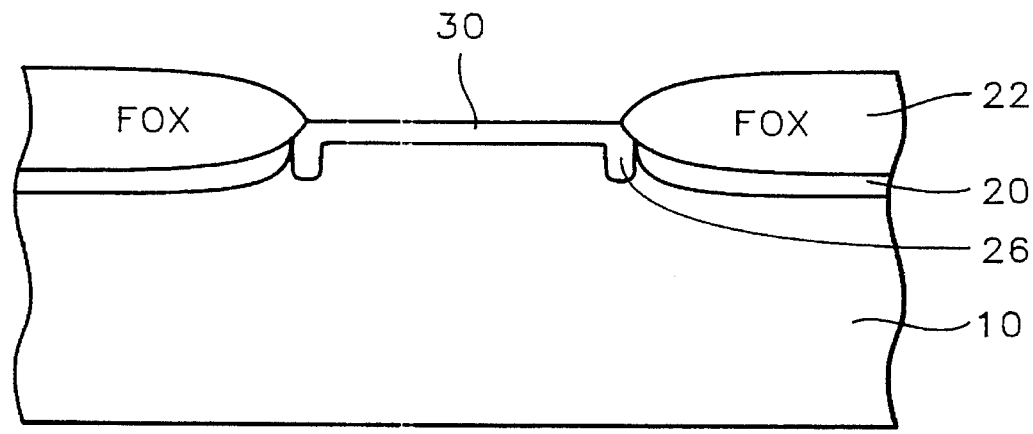
Figure 13:
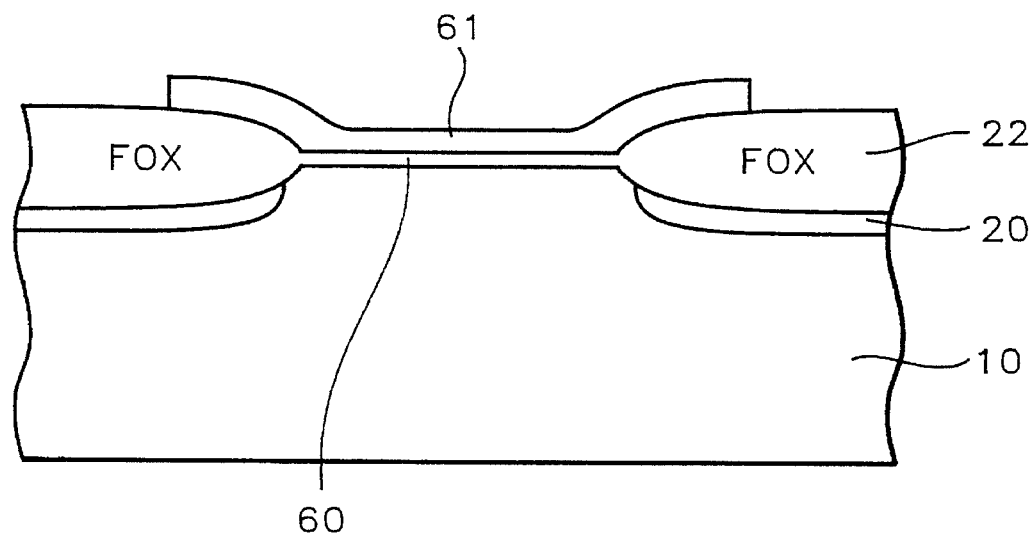

FIG. 10 illustrates a top view after polysilicon definition and source/drain implantation. The active area 30 is surrounded by field oxide 22. Polysilicon 61 on gate oxide 60 has been patterned across the interface of active area 30 and field oxide 22. FIGS. 11, 12, and 13 are the cross sections of views 11—11, 12—12, and 13—13, respectively, of FIG. 10.

Figure 1:
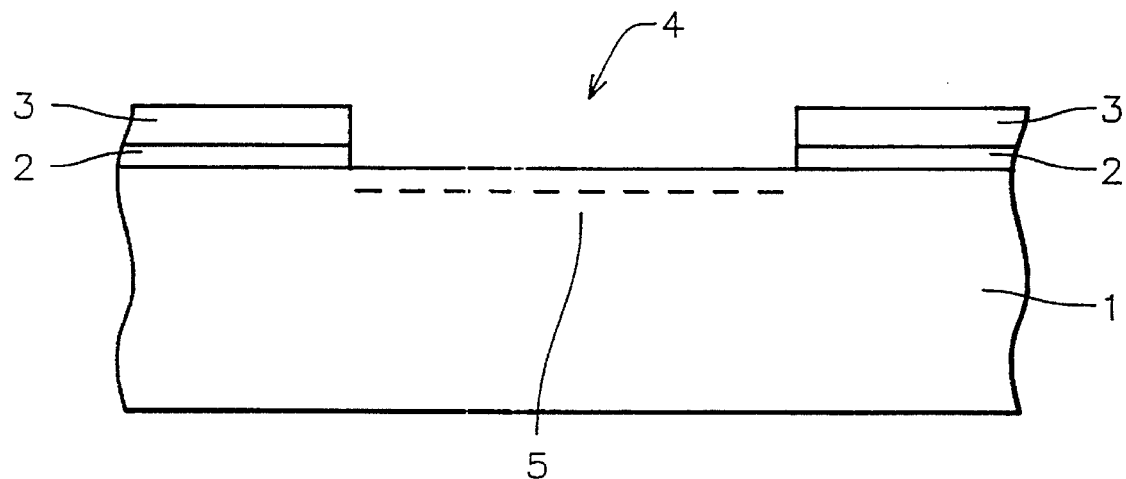
FIGS. 1 through 3 schematically illustrate in cross-sectional representation a LOCOS process of the prior art.
Figure 2:
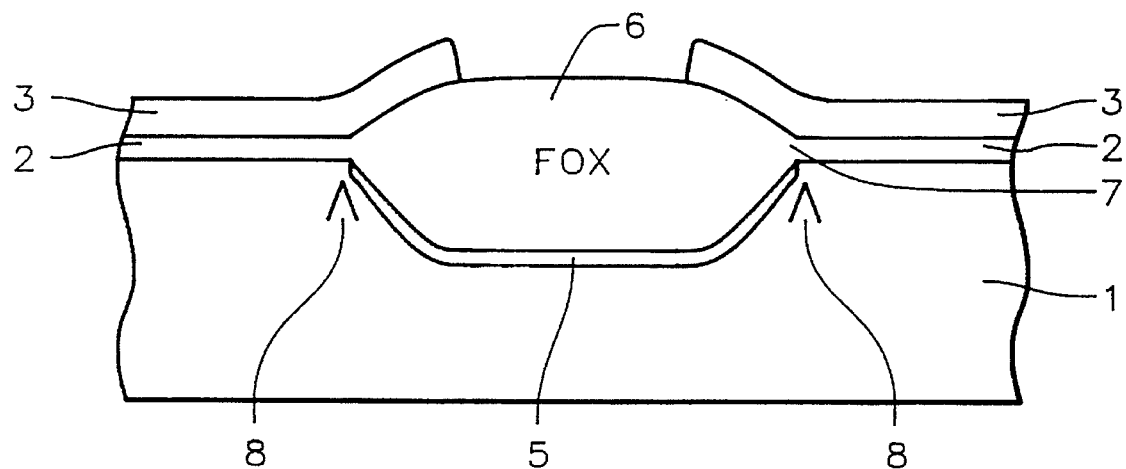
Figure 3:
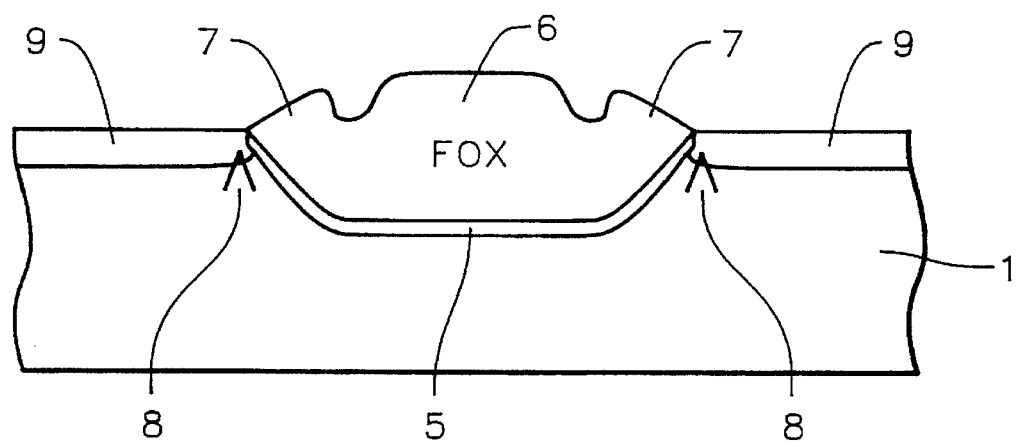
Figure 4:
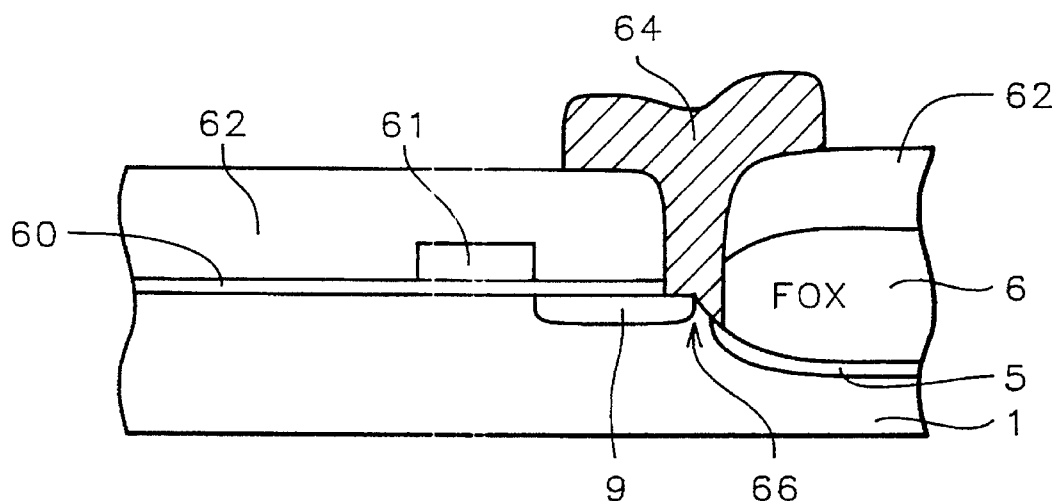
FIG. 4 schematically illustrates in cross-sectional representation a contact misalignment problem of the prior art.
Figure 5:
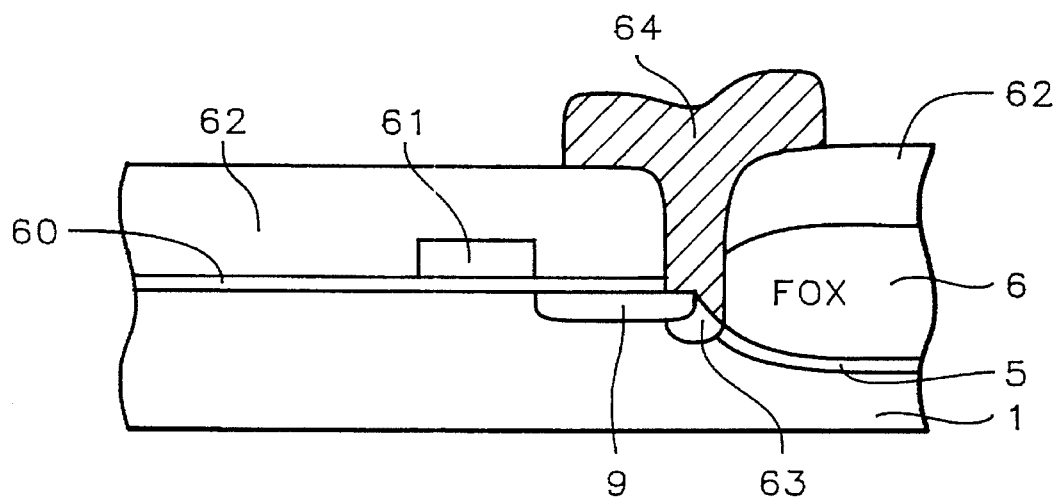
FIG. 5 schematically illustrates in cross-sectional representation a plug or contact implant of the prior art.
Figure 14:
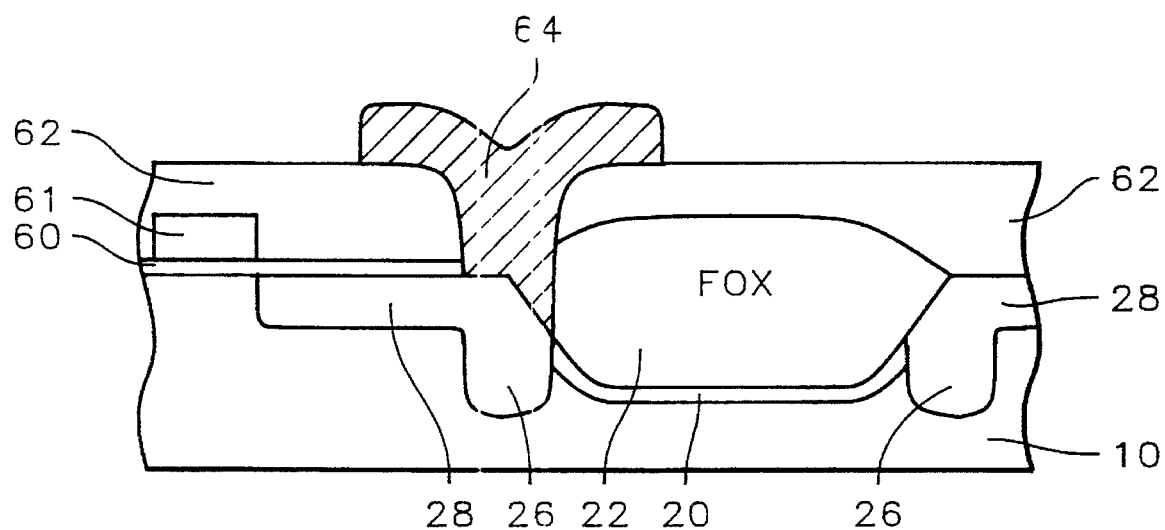

Referring now to FIG. 14, an insulating layer 62 composed of borophosphosilicate glass (BPSG), or the like, has been deposited over the patterned polysilicon gate lines. A contact opening has been made through the insulating layer 62 to contact the source/drain region 28. However, the contact opening is misaligned and exposes some of the substrate under the field oxide region 22. When the contact is filled with metal 64, no short will occur unlike the case illustrated in FIG. 4. The additional high-energy source/drain implantation 26 prevents shorting in this case.

Figure 15:
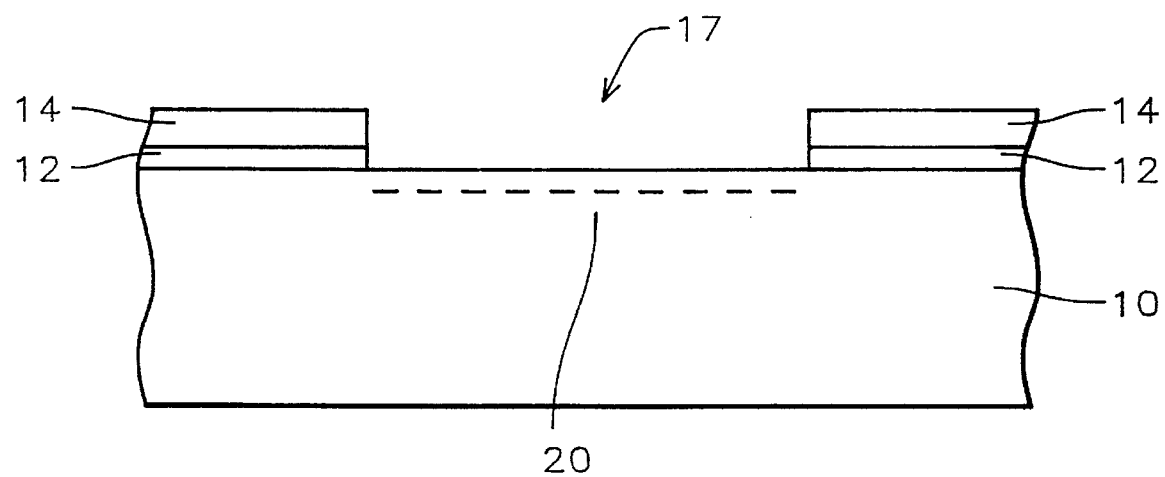
FIGS. 15 through 19 schematically illustrate in cross-sectional representation a completed integrated circuit of the present invention.

Referring now to FIGS. 15 through 19, a second preferred embodiment of the invention will be described. Referring now more particularly to FIG. 15, there is shown a monocrystalline silicon substrate 10. A pad oxide layer 12 of silicon dioxide is chemically vapor deposited (CVD) or thermally grown on the surface of the substrate to a preferred thickness of between about 100 to 500 Angstroms. A silicon nitride layer 14 is deposited by CVD to a thickness of between about 500 to 2500 Angstroms. The pad oxide and silicon nitride layers are patterned to leave openings 17 exposing portions of the silicon substrate where the local oxidation will take place.

Channel-stops 20 are selectively ion implanted into the substrate through the opening 17. For example, boron ions are implanted with a dosage of between about 1 E 13 to 1 E 14 atoms/cm$^2$ and at an energy of between about 10 to 50 KeV. The channel-stop implants serve to prevent inversion of p-type silicon under the field oxide.

Figure 16:
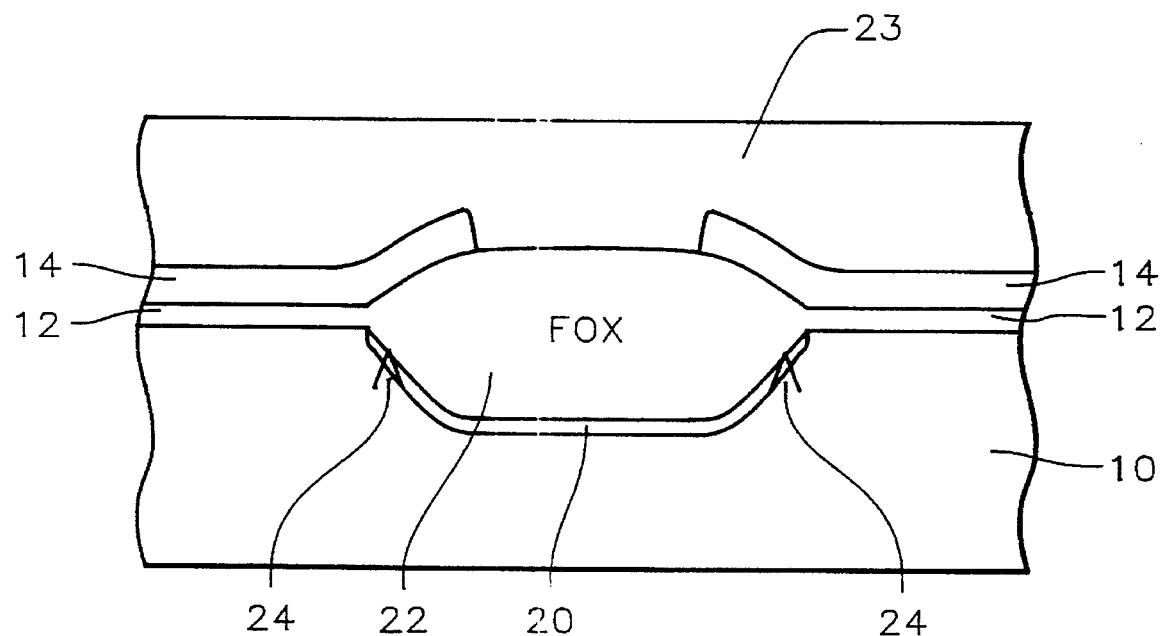

Referring now to FIG. 16, field oxidation is performed within the openings 17 at a temperature of between about 850° to 1050° C. for between about 10 to 720 minutes. Field oxide region 22 is formed. Crystalline defects 24, generated by stress, form in the silicon substrate under the bird's beak area of the field oxide region.

Figure 17:
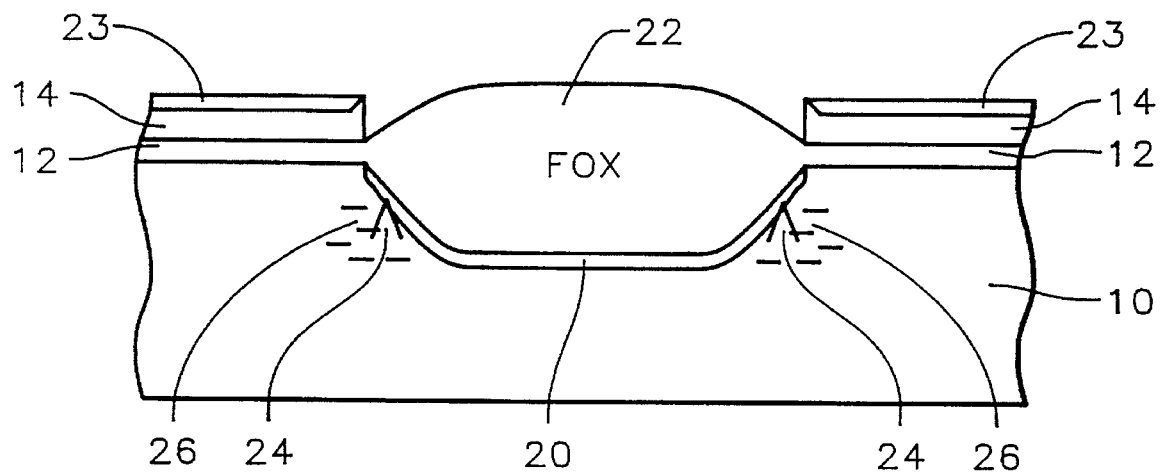

A planarizing layer 23 is coated over the substrate. This layer may be composed of spin-on-glass, polyimide, or a photoresist material. The top planarizing layer 23 is etched back to the field oxide 22 using reactive ion etching using $CHF_3$, $O_2$, Ar, or the like, or it is planarized using chemical mechanical polishing (CMP). As shown in FIG. 17, the purpose of this etchback or polishing is to remove the top silicon nitride corner. Some of the planarizing layer 23 remains. The portions of the silicon nitride layer 14 not covered by the planarizing layer 23 are removed by a reactive ion etch using $SF_6$ and He, or the like.

As above, the key high-energy source/drain implant is now performed. The ions and dosage used are the same as or similar to that which will be used in the normal source/drain implantation to be performed later. The energy used is higher than the normal source/drain implant in order to form a deeper junction. This high-energy implantation will drive the ions 26 deep into the substrate into the location of the crystalline defects 24. The energy must be large enough to form a deep enough junction to envelope all the stress-induced crystalline defects around the field oxide. On the other hand, the energy should not be large enough to penetrate the field oxide as well as the stacked layers of pad oxide 12, silicon nitride 14, and silicon dioxide 16. Energies for this implantation can be roughly estimated to be between about 25 to 70 KeV for B+, 110 to 300 for $BF_2$+, 60 to 200 KeV for P+, and 150 to 450 for As+ ions. Among these ions, B+ and $BF_2$+ are used for PMOS and P+ and As+ are used for NMOS.

Figure 18:
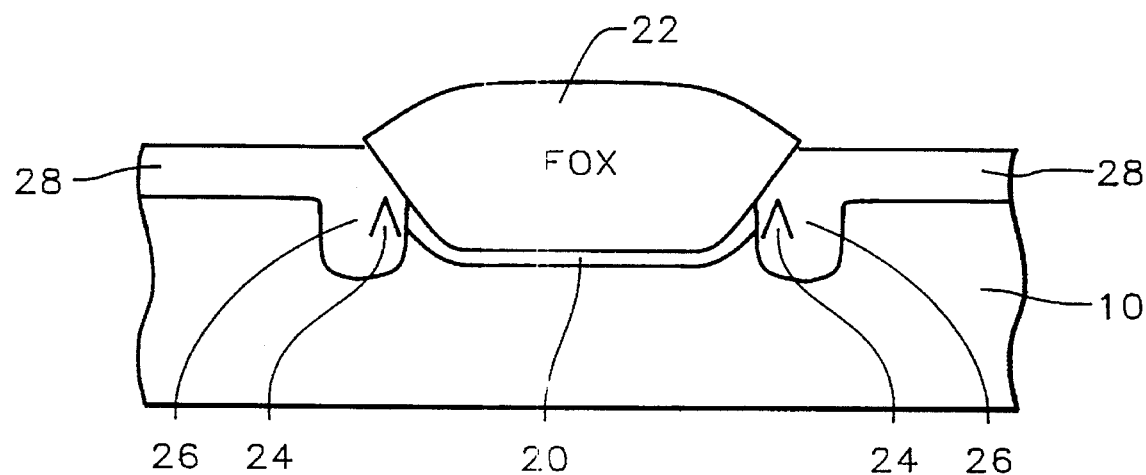
Figure 19:
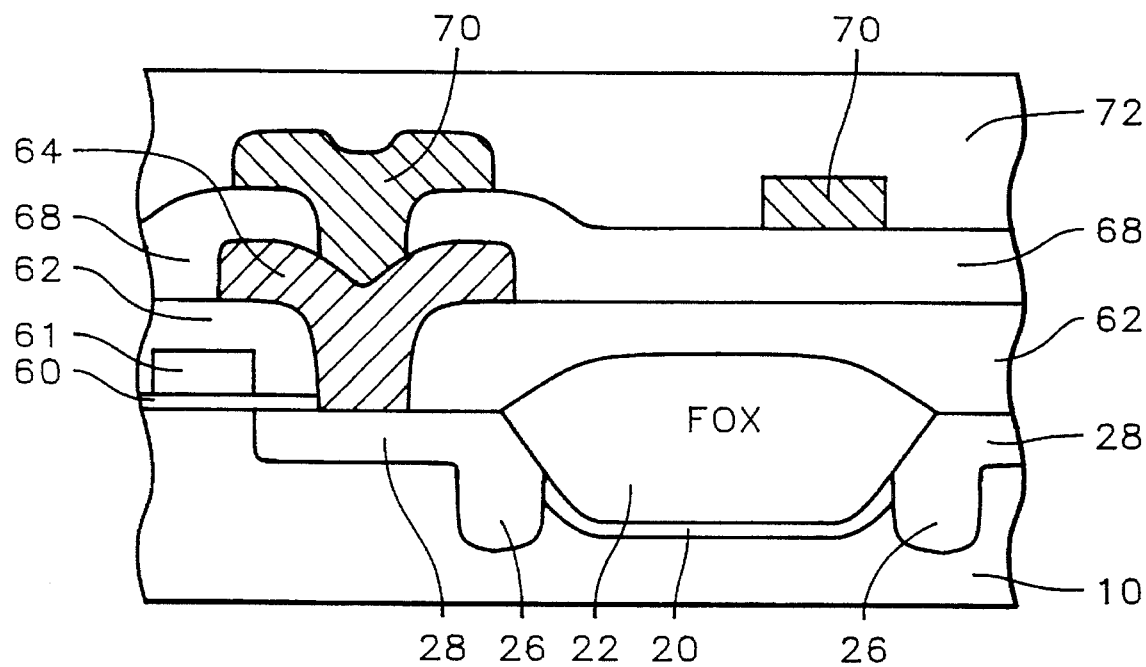

Referring now to FIG. 18, the silicon nitride layer 14 is stripped by hot $H_3PO_4$. The top silicon dioxide layer 16 is removed by lift-off. Alternatively, the top silicon dioxide layer 16 could be removed before the stripping of the silicon nitride layer 14 by dipping in a hydrofluoric acid solution. This would also remove some of the top layer of the field oxide 22 resulting in a more planarized surface. The pad oxide layer 12 is removed by dipping in a hydrofluoric acid solution. A gate silicon oxide layer is now formed as is conventional in the art followed by polysilicon gate electrode fabrication, not shown. Source/drain regions 28 are now formed as described for the first embodiment using a normal source/drain implantation with normal energy of between about 15 to 100 KeV.

This completes the local oxidation of the integrated circuit. The additional high-energy source/drain implantation shifts the junction into the silicon substrate under the bird's beak of the field oxide. The crystalline defects are all enveloped in the deeper junction. The new source/drain to substrate junctions are free from any crystalline defects to create leakage paths. The defect-free junction results in reduced junction leakage. Also, the shifted junction prevents shorting caused by contact misalignment without requiring the use of a plug or contact implantation. In addition, since the shifted junction 26 under the bird's beak of the field oxide is indeed connected to the normal source/drain to substrate junction 28, the active width is widened rather than narrowed as in the conventional LOCOS scheme.

The integrated circuit may be completed as is conventional in the art. For example, referring to FIG. 19, gate oxide layer 60 and gate electrode 61 are shown. Insulating layer 62 covers the substrate. Contact openings are etched through the dielectric layer 62 to expose the source/drain regions where contacts are desired. Metal layer 64, typically aluminum, is deposited and patterned to complete contacts to the source/drain regions followed by the deposition of an intermetal dielectric layer 68. Optionally, a second metallization 70 is deposited and patterned. A top capping layer 72 of silicon nitride and/or an oxide complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming a device isolation region of an integrated circuit with reduced junction leakage comprising:

providing an insulating layer over the surface of a silicon substrate;

depositing a silicon nitride layer overlying said insulating layer;

depositing a silicon dioxide layer overlying said silicon nitride layer;

etching away portions of said silicon dioxide, said silicon nitride, and said insulating layers not covered by a mask to provide an opening to said silicon substrate where said device isolation region is to be formed;

forming silicon nitride spacers on the sidewalls of said opening;

selectively ion implanting channel-stops through said opening into said substrate underneath said opening;

oxidizing said silicon substrate within said opening wherein said silicon substrate is transformed to silicon dioxide to form said device isolation region and wherein stress-generated crystalline defects are formed underlying said device isolation region at the edges of said opening;

removing said silicon nitride spacers;

implanting ions with energy high enough so that said ions form implanted regions deep enough into said silicon substrate wherein said crystalline defects are enclosed within said implanted regions and wherein the enclosure of said crystalline defects within said implanted regions reduces junction leakage wherein said ions are implanted through a mask consisting of said silicon nitride layer, said silicon dioxide layer, said device isolation region, and an additional photoresist with a polysilicon pattern to provide said implanted regions around said device isolation region and at the edges of said device isolation region and to prevent said implanted regions from being present under polysilicon lines to be defined in a later process step; and removing said silicon dioxide, silicon nitride, and said insulating layers completing said device isolation of said integrated circuit.

2. The method of claim 1 wherein said insulating layer is composed of silicon dioxide and has a preferred thickness of between about 100 to 500 Angstroms.

3. The method of claim 1 wherein said silicon nitride layer is deposited by chemical vapor deposition (CVD) to a thickness of between about 500 to 2500 Angstroms.

4. The method of claim 1 wherein said silicon dioxide layer is deposited by chemical vapor deposition (CVD) to a thickness of between about 500 to 2000 Angstroms.

5. The method of claim 1 wherein said silicon nitride spacers are formed by depositing a layer of silicon nitride to a thickness of between about 1000 to 2000 Angstroms and anisotropically etching away said silicon nitride layer leaving said silicon nitride spacers on the sidewalls of said opening.

6. The method of claim 1 wherein said implanting ions to form implantation regions within said substrate is performed at a high energy of between about 25 to 450 KeV.

7. The method of forming a field oxidation region of an integrated circuit with reduced junction leakage comprising:

providing a pad silicon oxide layer over the surface of a silicon substrate;

depositing a silicon nitride layer overlying said pad silicon oxide layer;

depositing a silicon dioxide layer overlying said silicon nitride layer;

etching away portions of said silicon dioxide, said silicon nitride, and said pad silicon oxide layers not covered by a mask to provide an opening to said silicon substrate where said field oxidation region is to be formed;

forming silicon nitride spacers on the sidewalls of said opening;

selectively ion implanting channel-stops through said opening into said substrate underneath said opening;

oxidizing said silicon substrate within said opening wherein said silicon substrate is transformed to silicon dioxide to form said field oxidation region and wherein stress-generated crystalline defects are formed underlying said field oxidation region at the edges of said opening;

removing said silicon nitride spacers;

implanting ions with energy high enough so that said ions form implanted regions deep enough into said silicon substrate wherein said crystalline defects are enclosed within said implanted regions and wherein the enclosure of said crystalline defects within said implanted regions reduces junction leakage wherein said ions are implanted through a mask consisting of said silicon nitride layer, said silicon dioxide layer, said device isolation region, and an additional photoresist with a polysilicon pattern to provide said implanted regions around said device isolation region and at the edges of said device isolation region and to prevent said implanted regions from being present under polysilicon lines to be defined in a later process step; and removing said silicon dioxide, silicon nitride, and said pad silicon oxide layers completing said field oxidation of said integrated circuit.

8. The method of claim 7 wherein said pad silicon oxide layer has a preferred thickness of between about 100 to 500 Angstroms.

9. The method of claim 7 wherein said silicon nitride layer is deposited by chemical vapor deposition (CVD) to a thickness of between about 500 to 2500 Angstroms.

10. The method of claim 7 wherein said silicon dioxide layer is deposited by chemical vapor deposition (CVD) to a thickness of between about 500 to 2000 Angstroms.

11. The method of claim 7 wherein said silicon nitride spacers are formed by depositing a layer of silicon nitride to a thickness of between about 1000 to 2000 Angstroms and anisotropically etching away said silicon nitride layer leaving said silicon nitride spacers on the sidewalls of said opening.

12. The method of claim 7 wherein said implanting ions to form implantation regions within said substrate is performed at a high energy of between about 25 to 450 KeV.

13. The method of forming a field oxidation region of an integrated circuit with reduced junction leakage comprising:

providing a pad silicon oxide layer over the surface of a silicon substrate;

depositing a silicon nitride layer overlying said pad silicon oxide layer;

etching away portions of said silicon nitride and said pad silicon oxide layers not covered by a mask to provide an opening to said silicon substrate where said field oxidation region is to be formed;

selectively ion implanting channel-stops through said opening into said substrate underneath said opening;

oxidizing said silicon substrate within said opening wherein said silicon substrate is transformed to silicon dioxide to form said field oxidation region and wherein stress-generated crystalline defects are formed underlying said field oxidation region at the edges of said opening;

coating the surface of said substrate with a planarizing layer;

removing portions of said planarizing layer above the top surface of said field oxidation region;

removing said silicon nitride layer not covered by said remaining planarizing layer;

implanting ions with energy high enough so that said ions form implanted regions deep enough into said silicon substrate wherein said crystalline defects are enclosed within said implanted regions and wherein the enclosure of said crystalline defects within said implanted regions reduces junction leakage;

removing said silicon nitride and said pad silicon oxide layers completing said field oxidation of said integrated circuit.

14. The method of claim 13 wherein said pad silicon oxide layer has a preferred thickness of between about 100 to 500 Angstroms.

15. The method of claim 13 wherein said silicon nitride layer is deposited by chemical vapor deposition (CVD) to a thickness of between about 500 to 2500 Angstroms.

16. The method of claim 13 wherein said planarizing layer is composed of spin-on-glass material.

17. The method of claim 13 wherein said planarizing layer is composed of polyimide.

18. The method of claim 13 wherein said planarizing layer is composed of photoresist material.

19. The method of claim 13 wherein said portions of said planarizing layer are removed by reactive ion etching.

20. The method of claim 13 wherein said portions of said planarizing layer are removed by chemical mechanical polishing.

21. The method of claim 13 wherein said exposed silicon nitride layer is removed by reactive ion etching.

22. The method of claim 13 wherein said implanting ions to form implantation regions within said substrate is performed at a high energy of between about 25 to 450 KeV.

* * * * *